United States Patent [19]

Lewis

[11] Patent Number: 4,613,561

[45] Date of Patent: Sep. 23, 1986

[54] METHOD OF HIGH CONTRAST POSITIVE O-QUINONE DIAZIDE PHOTORESIST DEVELOPING USING PRETREATMENT SOLUTION

[75] Inventor: James M. Lewis, 496 Shetland, Williamsville, N.Y. 14221

[73] Assignee: James Marvin Lewis, Williamsville, N.Y.

[21] Appl. No.: 661,751

[22] Filed: Oct. 17, 1984

[51] Int. Cl.[4] ............................................. G03F 7/26
[52] U.S. Cl. .................................. 430/326; 430/296; 430/331; 430/192
[58] Field of Search ............... 430/326, 309, 331, 192, 430/296

[56] References Cited

U.S. PATENT DOCUMENTS

| | | | |
|---|---|---|---|
| 3,586,504 | 6/1971 | Coates et al. | 430/331 |
| 3,868,254 | 2/1975 | Wemmers | 430/191 |
| 3,891,439 | 6/1975 | Katz et al. | 430/331 |
| 3,961,100 | 6/1976 | Harris et al. | 427/43 |
| 3,961,101 | 6/1976 | Barton | 430/296 |
| 4,212,935 | 7/1980 | Canavello et al. | 430/326 |
| 4,275,100 | 6/1981 | Datta | 428/65 |
| 4,302,348 | 11/1981 | Requejo | 252/135 |
| 4,307,178 | 12/1981 | Kaplan et al. | 430/296 |
| 4,359,520 | 11/1982 | Carothers et al. | 430/326 |

OTHER PUBLICATIONS

Gouss, G. et al., *IBM Tech. Discl Bulletin,* vol. 27, No. 1A, pp. 377–378, 6/1984.

*Primary Examiner*—Charles L. Bowers, Jr.
*Attorney, Agent, or Firm*—Felfe & Lynch

[57] ABSTRACT

A positive photoresist aqueous alkaline two-step developing method is provided that gives a high contrast to the photoresist.

The developer disclosed comprises a formulation of aqueous alkali-base such as potassium hydroxide and a fluorocarbon or carboxylated surfactant. The incorporation of the fluorocarbon or carboxylated surfactant provides the unexpected increase in the contrast of the photoresist. A double dip method in effecting development of the exposed film is used. The contrast and sensitivity of the photoresist remains essentially unchanged over the life of the bath.

The high contrast photoresist provides linewidth control and affords improved processing uniformity in photoresist imaging.

7 Claims, No Drawings

METHOD OF HIGH CONTRAST POSITIVE O-QUINONE DIAZIDE PHOTORESIST DEVELOPING USING PRETREATMENT SOLUTION

BACKGROUND OF THE INVENTION

Field of the Invention

This invention relates to a positive photoresist developer system and improved method for developing positive photoresist layers, and more particularly, to an improved two-step developer system used in the processing of alkali soluble resin—diazo ketone photoresists to increase the contrast of the developed photoresists. The process of the invention involves the use of a two bath system wherein the substrate coated with positive photoresist is exposed, then immersed in a "pre-dip" bath, rinsed, and then immersed in the second of the two bath system developer baths.

Positive photoresists typically consist of a novolac resin and a diazonaphthaquinone sulfonic acid ester dissolved in an organic solvent. The resist is usually applied by a spin casting technique to silicon wafers which may have a thin coating of silicon dioxide, aluminum, silicon nitride, glass or other material typically used in the fabrication of integrated circuits.

The coated wafers are exposed to light through a mask which provides a pattern for building the various circuit components on the wafer. The pattern is developed by dipping, spraying or placing a puddle of developer solution on the wafer. During spray or puddle development the wafer may be stationary or spun, but excess developer is usually spun off by accelerating the wafer to about 5000 rpm.

The base used in preparing the developer formulation may be selected from the general class of water soluble bases known for use for this purpose and include, for example, metal hydroxides, e.g. sodium hydroxide, potassium hydroxide, sodium silicate, potassium carbonate, and the like.

It is highly desirable that during development there be as little attack as possible on the unexposed resist under conditions which lead to complete removal of exposed resist layer down to the substrate. The lower the rate of dissolution of the unexposed resist relative to the exposed resist, the higher the contrast. High contrast gives a pattern with well defined vertical walls resulting in an accurate reproduction of the mask dimensions in the photoresist coating.

The present invention has application in the "lift-off" operation which is a simplified process during semiconductor manufacture for putting aluminum metal interconnects into place. The undercut resist profile comprises a shadow mask which permits aluminum vapor to be deposited on the substrate in a pattern determined by the developed openings in the resist film. The aluminum deposited on the resist is removed when the resist is dissolved away using a suitable solvent. The remaining aluminum is left firmly bonded to the substrate in a predetermined pattern of interconnects.

The "lift-off" process is described in U.S. Pat. No. 4,212,935. Control of the wall profile, according to the teaching of that patent, is achieved by predipping the resist coated wafer, after exposure but prior to development, into an organic solvent such as chlorobenzene. The use of toxic, combustible organic solvents is undesirable because of health, safety, and environmental concerns. The present invention involves the use of an aqueous solution containing a small amount of fluorochemical or carboxylated surfactant. Such aqueous solutions are preferred, from a health and safety viewpoint to organic solvents.

An unexpected feature of the double dip process using aqueous metal developers is that it permits control of the wall profile from vertical to undercut depending on the exposure; this ability to produce a profile which is broader at the top and narrower at the bottom is particularly important for use in the "lift-off" process.

In co-pending U.S. patent application, Ser. No. 505,571 filed on June 17, 1983, now abandoned and entitled "High Contrast Photoresist Developer," it is disclosed that the incorporation of a fluorochemical surfactant in an aqueous alkali metal development bath provides high contrast. In that system, which involves a single dip development with alkali metal developers, it has been observed that as the additional exposed wafers are developed, the contrast and sensitivity of the resist tend to deteriorate with prolonged use of the bath. It is thus apparent that a need exists for a safe and efficient system wherein the contrast and sensitivity of the photoresist remains essentially unchanged over the life of the bath.

SUMMARY OF THE INVENTION

In accordance with the invention, a positive photoresist metal ion aqueous base developer is provided that gives high contrast to the photoresist. The gamma obtained is greater than 5 and usually in excess of 7. The high contrast provides good linewidth control and process latitude in photoresist imaging.

In essence the invention resides in a novel process using metal ion developer compositions in a two bath system which provides high contrast images and long developer bath life that does not decrease significantly over the life of the development bath. The elements of this invention comprise a two bath system, i.e. (i) a predip solution containing aqueous alkali metal base and a fluorochemical or carboxylated surfactant adjusted to a concentration that does not necessarily give development, and (ii) a developer solution containing aqueous alkali metal hydroxide and, optionally, a fluorochemical or carboxylated surfactant adjusted to a concentration that provides a substantially complete development.

DESCRIPTION OF THE PREFERRED EMBODIMENT

The photoresists employed with the developer of the present invention are those sensitizer-resin compositions in which the exposed portions of the composition become more soluble upon exposure.

Suitable sensitizers used in positive photoresists of this kind are diazo ketones having diazo and keto groups at adjacent positions on the molecule, such as the quinone-diazide sulfonic acid derivatives which are described in U.S. Pat. Nos. 2,958,599; 3,046,110; 3,046,114; 3,046,116; 3,046,118; 3,046,119; 3,046,121; 3,046,122; 3,046,123; 3,106,465; 3,148,983; 3,635,709; 3,711,285; 4,174,222 which are hereby incorporated by reference. Examples of typical photosensitive compounds used in positive photoresists are shown in Table I.

TABLE I
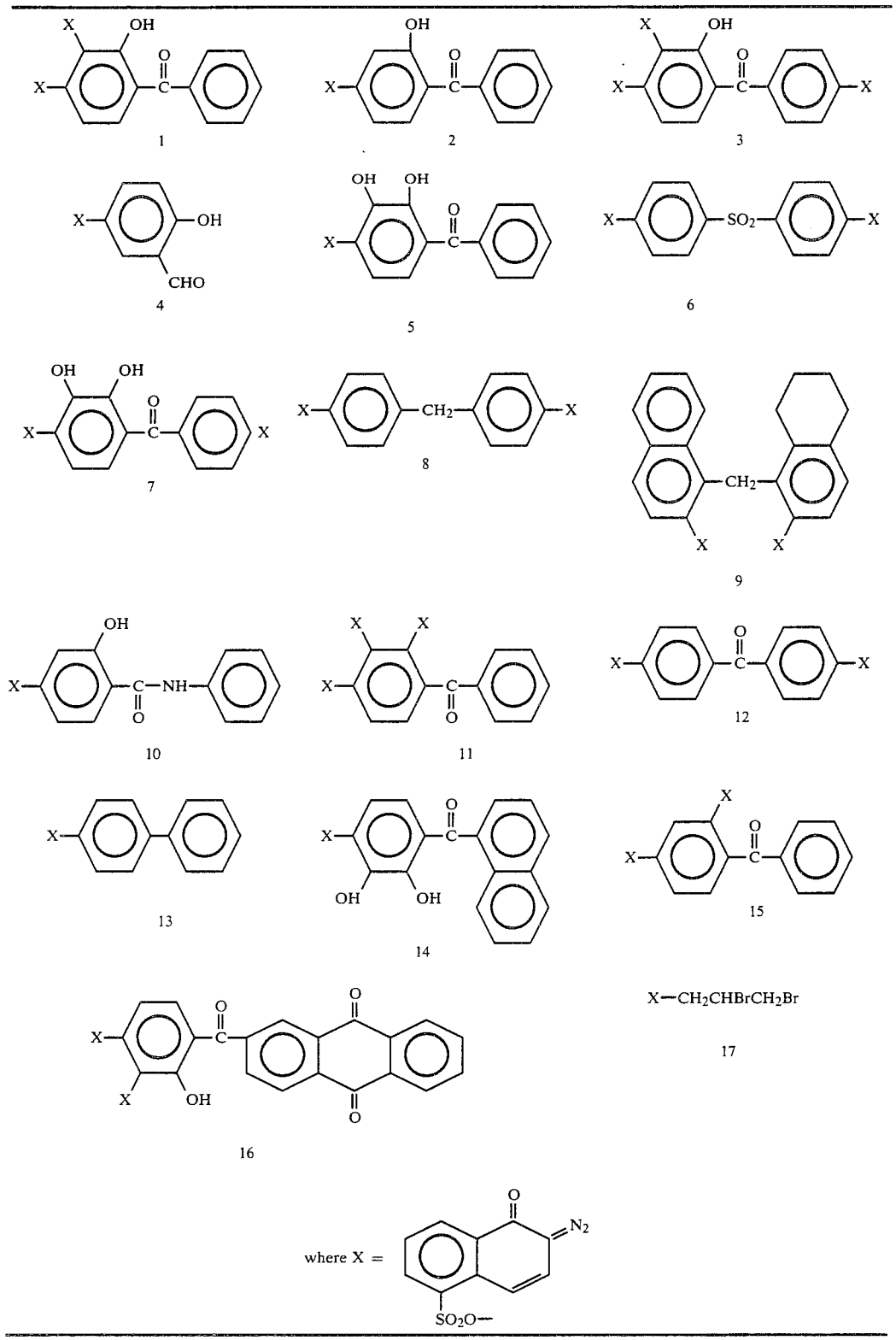
The photoactive compound acts to decrease the solubility of the resin. Upon exposure to light, the photoactive diazonapthoquinone undergoes a chemical reaction to form a carboxylic acid which increases the rate of solubilization of the photoresist in the exposed areas.

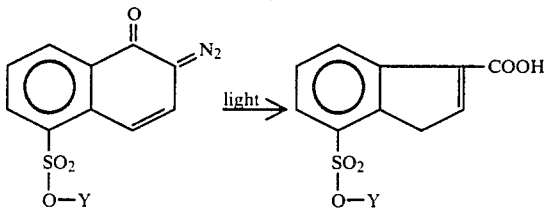

In general, photosensitizers which contain more than one diazonaphthoquinone group are preferred because they appear to provide higher contrast photoresists. Suitable alkali soluble resins may be employed in the positive photoresists. Those contemplated by this invention are the prepolymerized phenolic-aldehyde resins, e.g., phenol formaldehyde, which are known as novolac resins and are available commercially. Resins of this kind are disclosed, for example, in U.S. Pat. Nos. 3,201,239; 3,868,254; 4,123,219 and 4,173,470, the disclosures of which are incorporated herein by reference. These phenolic-aldehyde resinous compounds must be soluble in organic solvents and aqueous alkaline solutions.

A number of phenolic compounds and aldehyde or aldehyde producing compounds will yield novolac resins through well-known syntheses. Phenolic compounds that may be used include, but are not limited to, phenol, xylenol, cresol, resorcinol, naphthol, hydroquinone, alkyl phenols and halogenated phenols. Illustrative of the aldehydes and aldehyde producing compounds that may be used, but not limited to, are formaldehyde, actaldehyde, paraformaldehyde, formaline, acrolein, crotonaldehyde and furfural.

The predip bath applied in accordance with the invention comprises an aqueous basic solution containing as an essential constituent a fluorochemical or carboxylated surfactant.

Illustrative of the various bases that can be used in adjusting the alkalinity of the basic solution include, for example, potassium hydroxide, potassium carbonate, sodium hydroxide, sodium silicate, lithium hydroxide, tetramethyl ammonium hydroxide, (2-hydroxyethyl)-trimethyl-ammonium hydroxide, tetra-(2-hydroxide, hydroxy ethyl)-ammonium hydroxide, tetraethylammonium hydroxide or ammonium hydroxide and the like. The use of potassium carbonate and potassium hydroxide in particular afford practical advantages.

The fluorocarbon surfactants that can be used in the predip bath are those characterized by the formula $R_f\text{-}Y\text{-}(CH_2CH_2O)_mR$, wherein Y is a radical selected from the group $-CH_2CH_2O-$, $-SO_2NR'$, $SO_3$, $SO_2N(R')CH_2CO_2$, $CO_2$ and $-CO-NR'$ wherein $R_f$ is either a straight or branched chain of the formula $C_pF_{2p+1}$ where p is an integer from 3 to 17; and wherein R is hydrogen or an acyl or alkyl radical of 1 to 30 carbon atoms and m is an integer of 2 to 26 and preferably where m is an integer of 5-26, and R' is hydrogen or an alkyl radical of 1-6 carbon atoms. Illustrative of fluorocarbon surfactants of this kind are those included in Table II as well as, more mixtures thereof.

TABLE II

| Example | Fluorosurfactant |
|---------|------------------|
| a | $CF_3(CF_2)_6\text{—}CH_2CH_2O\text{—}(CH_2CH_2O)_4H$ |
| b | $CF_3(CF_2)_5\text{—}\overset{O}{\underset{\|}{C}}\text{—}N(CH_3)\text{—}(CH_2CH_2O)_{12}\text{—}CH_3$ |

TABLE II-continued

| Example | Fluorosurfactant |
|---------|------------------|
| c | $CF_3(CF_2)_3\text{—}SO_2\text{—}NH\text{—}(CH_2CH_2O)_{14}\text{—}CH_3$ |
| d | $CF_3(CF_2)_8\text{—}SO_2\text{—}O\text{—}(CH_2CH_2O)_8\text{—}CH_3$ |
| e | $CF_3(CF_2)_5\text{—}CO\text{—}O\text{—}(CH_2CH_2O)_9\text{—}C_4H_9$ |
| f | $CF_3(CF_2)_7SO_2N(C_2H_5)\text{—}(CH_2CH_2O)_{15}\text{—}\overset{O}{\underset{\|}{C}}\text{—}C_{14}H_{29}$ |
| g | $CF_3(CF_2)_8SO_2NCH_2\overset{CH_3}{\underset{\|}{C}}\overset{O}{\underset{\|}{}}[O(CH_2CH_2O)]_{10}C_{11}H_{23}$ |

The carboxylated surfactants which may be employed in the invention generally conform to the formula:

$$R\text{—}O\text{—}(C_nH_{2n}O)_mR_1COOX$$

wherein R is a fatty group of 6 to 18 carbon atoms, $R_1$ is a $C_1$ to $C_3$ alkyl substituent, n has a value of 2 to 4, m has a value of 1 to 100 and X is a cationic substituent select from the group consisting of $H^+$, $Na^+$, $K^+$, $Li^+$, $NH_4^+$, diethanolamine, triethanolamine $Al^{++}$, $Cu^{++}$, $Ca^{++}$, $Mg^{++}$ and $Sr^{++}$.

Typical carboxylated surfactants are identified in Table III in which the values for R and N for the Above formula are set out.

TABLE III

| | R | N |
|---|---|---|
| 1 | C13 | 7 |
| 2 | C12-C15 | 5 |
| 3 | C12 | 12 |
| 4 | C13 | 11 |
| 5 | C13 | 18 |
| 6 | C16-C18 | 4 |
| 7 | C16-C18 | 8 |
| 8 | C16-C18 | 24 |
| 9 | C18 | 12 |
| 10 | C16 | 12 |
| 11 | i-C18 | 5 |
| 12 | i-C18 | 10 |
| 13 | C6 | 1 |
| 14 | C2 | 4 |
| 15 | C4 | 4 |

The surfactants used in the development bath may be selected from the same group. The concentrations of surfactant in the developer in the range from about 0.0001% to 1.0% of the developer may be used with advantage. The more effective level of the fluorocarbon or carboxylated surfactant ranges from 0.005 to 0.5%. The preferred range is 0.001 to 0.1%. The concentration of alkali metal hydroxide must be varied accordingly to maintain the sensitivity level. The more surfactant, the more concentrated the developer needs to be.

The bases useful in the developer both are the metal hydroxide type. Illustrative of these bases are sodium hydroxide, potassium hydroxide, sodium silicate, and lithium hydroxide. The developer bath operates at a pH of at least 9 and generally at a pH above about 10.5. Preferably a pH above 12 is employed.

The concentration of surfactant used in the predip bath may range from 0.0001 to 1.0% of the predip bath. In general, the concentration of surfactant is greater in the predip bath than in the developer bath. The more effective level is between 0.001 to 1%. The disadvantage of higher levels of surfactant in the predip bath is primarily loss of excess surfactant.

The concentration of base of the kind referred to above in preparing the aqueous predip bath solution containing the fluorochemical or carboxylated surfactant should be sufficiently low that there is no significant dissolution of the photoresist film resulting in measurable film loss. Since photoresists vary in the ease with which they dissolve in aqueous alkali solutions, it will be necessary to adjust the base concentration to the solubility characteristics of the resist. The concentration of base in the predip solution may range from about 0.1% to 100% of the concentration of base in the developer. The preferred range is between 10% and 25% of the base strength in the developer.

The following examples are illustrative of the invention. The enumeration of details in the examples should not be interpreted as limitations except as may be expressed in the appended claims.

TYPICAL APPLICATION OF THE PHOTORESIST TO THE SUBSTRATE

A photoresist coating was prepared by spin coating a novolac resin and the photosensitizer of the kind identified by formula 15 of Table I. The substrate used was a silicon wafer that had been subjected to a 200° C. dehydration bake for at least sixteen (16) hours; and then treated with a 50% hexamethyldisilazane solution in xylene for twenty seconds immediately prior to coating. The wafers were spun so as to provide a 1 micrometer ($\mu$m) thick film. The coated wafers were baked at 100° C. for 30 minutes in a forced air convection oven. After baking, the wafers were exposed to ultraviolet light through an Opto-Line step tablet resolution mask with windows of various optical density so as to provide various exposure levels on the same wafer. The incident exposure was such that a range of exposure from no exposure to exposure sufficient for the resist to develop to the substrate was used.

EXAMPLE I

METAL ION DEVELOPER AND METAL ION PREDEVELOPMENT SOLUTION

The photoresist is coated, prebaked, and exposed in the conventional manner such as that described in the above spin coating procedure. The wafers are then immersed in a predip (predevelopment) solution of 0.135N KOH with 0.026% Zonyl FSN surfactant for 30 seconds, rinsed with water for 1 minute, then developed with a solution of 0.271N KOH, 0.0125% Zonyl FSN, and 0.0045% of novolac resin for 1 minute.

Immersion of the wafers in the 0.135N KOH with 0.026% Zonyl FSN surfactant predip solution alone does not develop the resist. Rather, the predip step coats or modifies the surface allowing the developer to remove the exposed photoresist and maintain a constant sensitivity and high contrast throughout the life of the developer. The sensitivity throughout the bath life was 16–18 mJ/cm$^2$. The gamma or contrast was 8–7.

EXAMPLE II (Comparative)

The procedure of Example I was repeated except that the predevelopment solution is not used. The gamma or contrast is found to change from 8 to 3 during the bath life of the developer.

SEM photographs of the image show a profile that can be used in a metal lift-off process when the metal ion pretreatment solution is used with the metal ion developer. The profile is similar to that obtained using chlorobenzene to pretreat the photoresist.

EXAMPLE III

The photoresist is coated, prebaked, and exposed in the conventional manner such as that desribed in the typical application above. The wafers were then immersed in a predip solution of 0.036N potassium hydroxide with 83 ppm of alkyl polyoxyethylene carboxylate surfactant (Formula 1, Table III) for 30 seconds, rinsed with water for 30 seconds, then developed in 0.2N potassium hydroxide for 75 seconds.

The sensitivity was 18 mj/cm$^2$ and the contrast was 5.0 throughout the bath life of the developer.

EXAMPLE IV

The procedure of Example III was repeated except that surfactant (Formula 2, Table III) is used in the predip solution.

The sensitivity was 25 mj/cm$^2$ and the contrast was 7 throughout the life of the developer.

In addition to the alkyl polyoxyethylene carboxylate employed in Examples III and IV, various other carboxylated surfactants, the chemical formulas of which are represented in Table III, may be used, e.g. lauryl dodeca(ethyleneoxy) 2-acetic acid, 2[hexylpoly(ethylene)]acetic acid and the like.

While the invention has been described with reference to positive photoresists sensitive to ultraviolet light (290–500 nm), the novel developer is applicable also to positive electron beam, X-ray, ion beam, deep ultraviolet (220–290 nm) light and other radiation sensitive resists.

The invention has been particularly described with reference to preferred embodiments thereof; it will be understood by those skilled in the art, however, that changes in form and details may be made therein without departing from the spirit and scope of the invention.

I claim:

1. In a process for developing a positive radiation sensitive resist film comprised of quinone diazide sulfonic acid derivatives and alkali soluble resin that has been coated on a substrate and an image thereon is exposed to radiation and thereafter developing this exposed resist film to form a contrasting surface relief pattern between the exposed image and the unexposed resist film, the improvement which comprises:

(a) contacting the exposed film with an aqueous alkaline pretreatment solution containing from about 0.001 percent to about 1.0 percent based on the weight of the pretreatment solution of the surfactant selected from the group consisting of a fluorocarbon or carboxylated surfactant and sufficient base to provide alkalinity (b) subjecting the pretreated film obtained from step (a) to an aqueous rinsing; and (c) contacting the thus pretreated film from step (b) with an aqueous developer solution having a pH of at least 9 and containing at least 0.0001 percent based on the weight of the developer of a surfactant selected from the group consisting of fluorocarbon and carboxylated surfactants to dissolved the exposed image on said film.

2. The process of claim 1 in which the alkalinity strength of the pretreatment solution of step (a) is from about 10% to about 75% of the alkalinity strength of the developer solution of step (c).

3. The process of claim 1 in which the surfactant is present in the range of 0.001 percent to 0.1 percent based on the total weight of the developer.

4. The process of claim 1 wherein the alkalinity of the pretreatment solution in step (a) is adjusted by the addition of potassium hydroxide.

5. The process of claim 1 wherein the alkalinity of the pretreatment solution in step (a) is adjusted by the addition of potassium hydroxide.

6. The process of claim 1 in which the surfactant employed in steps (a) and (c) is a fluorocarbon surfactant and is characterized by the formula $R_f\text{-}Y\text{-}(CH_2CH_2O)_mR$ wherein Y is a radical selected from the group $-CH_2CH_2O-$, $-SO_2NR'$, $SO_3$, $SO_2N(R')CH_2CO_2$, $CO_2$ and $-CO-NP'$ wherein $R_f$ is either a straight or branched chain of the formula $C_pF_{2p+1}$ wherein p is an integer from 3 to 17; and wherein R is hydrogen or an acyl or alkyl radical of 1 to 30 carbon atoms and m is an integer of 2 to 26 and preferably where m is an integer of 5–26, and R' is hydrogen or an alkyl radical of 1–6 carbon atoms.

7. The process of claim 1, in which the surfactant employed in steps (a) and (c) is a carboxylated surfactant characterized by the formula:

$$R\text{-}O\,(C_nH_{2n}O)_mR_1COOX$$

wherein R is a fatty alkyl group of 6 to 8 carbon atoms, $R_1$ is a $C_1$ to $C_3$ alkyl substituent, n has a value a value of 2 to 4, m has a value of 1 to 100 and X is selected from the group consisting of $H^+$, $Na^+$, $K^+$, $Li^+$, $NH_4$, diethanolamine triethanolamine, $Al^{++}$, $Cu^{++}$, $Mg^{++}$ and $Sr^{++}$.

* * * * *

UNITED STATES PATENT OFFICE
CERTIFICATE OF CORRECTION

PATENT NO. : 4,613,561
DATED : September 23, 1986
INVENTOR(S) : James M. Lewis

It is certified that error appears in the above-identified patent and that said Letters Patent is hereby corrected as shown below:

In column 9, line 9, change "potassium hydroxide" to -- potassium carbonate --.

In column 10, line 11, change "6 to 8" to -- 6 to 18 --.

Signed and Sealed this

Twenty-third Day of June, 1992

Attest:

DOUGLAS B. COMER

*Attesting Officer*    *Acting Commissioner of Patents and Trademarks*